United States Patent
Wang

(10) Patent No.: US 8,673,776 B2
(45) Date of Patent: Mar. 18, 2014

(54) METHOD FOR MANUFACTURING SEMICONDUCTOR DEVICE HAVING INTERLAYER DIELECTRIC LAYERS AND A GATE CONTACT

(75) Inventor: Xinpeng Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 63 days.

(21) Appl. No.: 13/305,417

(22) Filed: Nov. 28, 2011

(65) Prior Publication Data

US 2012/0295412 A1    Nov. 22, 2012

(30) Foreign Application Priority Data

May 20, 2011    (CN) .......................... 2011 1 0131055

(51) Int. Cl.
*H01L 21/44*    (2006.01)

(52) U.S. Cl.
USPC .......................................... 438/672; 438/674

(58) Field of Classification Search
None
See application file for complete search history.

(56) References Cited

U.S. PATENT DOCUMENTS

2011/0062502 A1*    3/2011    Yin et al. .................... 257/288

\* cited by examiner

*Primary Examiner* — Scott B Geyer
(74) *Attorney, Agent, or Firm* — Koppel, Patrick, Heybl & Philpott; Michael J. Ram

(57) ABSTRACT

A method for manufacturing a semiconductor device comprises: providing a substrate having an active area and a gate structure on the active area and formed with a first interlayer dielectric layer thereon, wherein the first interlayer dielectric layer has a first open to expose a portion of a surface of the active area, and an upper surface of the first interlayer dielectric layer is substantially flush with an upper surface of the gate; filling the first open with a first conductive material to form a first portion of contact; forming a second interlayer dielectric layer over the first interlayer dielectric layer, the second interlayer dielectric layer having a second open to substantially expose an upper part of the first portion of the contact in the first open; and filling the second open with a second conductive material to form a second portion of the contact.

9 Claims, 3 Drawing Sheets

METHOD FOR MANUFACTURING SEMICONDUCTOR DEVICE HAVING INTERLAYER DIELECTRIC LAYERS AND A GATE CONTACT

CROSS-REFERENCE TO RELATED APPLICATIONS

This application claims priority to Chinese Patent Application No. 201110131055.2, filed on May 20, 2011 and entitled "Method for Manufacturing Semiconductor Device", which is incorporated herein in its entirety by reference.

BACKGROUND OF THE INVENTION

1. Field of the Invention

The present invention relates to the field of semiconductor assembly techniques, and more specifically, to a method for manufacturing a semiconductor device.

2. Description of the Related Art

As semiconductor assembly techniques have been developed, the critical dimension (CD) of a contact has been shrunk greatly, especially for current logic device technology.

As known by those skilled in the art, there are gate-last approaches and gate-first approaches for field-effect transistor manufacturing processes.

In the gate-last approach, a dielectric layer 707 and a dummy gate are formed on a substrate 709, preferably, a lightly doped region (LDD) implantation is carried out herein and then a spacer 703 is formed. After the formation of a gate structure with the dummy gate as described above, source region and drain region implantations are carried out. A first interlayer dielectric layer 705 is then formed and a chemical-mechanical polishing (CMP) process is performed, so as to substantially expose the upper surface of the dummy gate. The dummy gate is then removed and thereafter, a gate dielectric layer and a metal gate are formed, for example, by depositing gate dielectric (in some certain embodiments, it may be a high-K dielectric) and metal gate materials followed by a CMP process so as to form a gate 701. Re-coating of an interlayer dielectric is performed on the gate; a contact hole is subsequently formed, as shown in FIG. 7.

The gate-first approach is similar to the conventional method of forming poly-silicon gate devices. Dielectric layer 707 and gate 701 are formed on a substrate 709. Preferably, the LDD implantation is carried out herein and then the spacer 703 is formed. After the formation of the gate structure as described above, source region and drain region implantations are carried out. A first interlayer dielectric layer 705 is formed to cover the gate and then a contact hole is formed, as shown in FIG. 7.

Generally, covering the gate with the first interlayer dielectric layer 705 is mainly for facilitating the formation of contact holes 721, 723 to the gate and/or the active area, which contact holes are used for forming contact or wiring).

However, with the shrinkage of contact critical dimension, the manufacturing process encounters some challenges, and the risk of open contacts is increased as well. For example, due to the shrinkage of contact critical dimension, a relatively thick resist may cause the etching of a contact hole (or, an open) stop. Moreover, it is difficult to scale the contact CD down to a desired target value.

Further, for a contact hole shared by a contact to the active area and a contact to the gate, an open circuit problem may be encountered. Due to thick resist or overlying variation, the connection between the active area and the gate may be worsened. Besides, the spacer may be etched, leading to an increase of the leakage from the top of the gate.

In addition, the aspect ratio is high for metal CVD (chemical vapour deposition) processes for the contact formation. Therefore, it is difficult to properly control the resistance of the contact so as to be consistent with the designed or desired resistance. Besides, the interlayer dielectric layer deposition has a small process window, which may result in voids.

Therefore, there exists a need to mitigate or address the above problems. To this end, the inventors herein propose a novel and creative method for manufacturing semiconductor devices, so as to mitigate or eliminate one or more problems existing in the prior art.

SUMMARY OF THE INVENTION

An object of the present invention is to at least mitigate or address the aforementioned one or more problems.

An object of an embodiment of the present invention is to provide a method for manufacturing a semiconductor device, which comprises: providing a substrate for the semiconductor device, the substrate having an active area and a gate structure including a gate on the active area and being formed with a first interlayer dielectric layer over the substrate, wherein the first interlayer dielectric layer has a first opening penetrating through the first interlayer dielectric layer so as to expose a portion of a surface of the active area, and an upper surface of the first interlayer dielectric layer is substantially flush (or aligned) with an upper surface of the gate; filling the first opening with a first conductive material to form a first portion of a contact; forming a second interlayer dielectric layer over the first interlayer dielectric layer, the second interlayer dielectric layer having a second opening penetrating through the second interlayer dielectric layer so as to substantially expose an upper part of the first portion of the contact in the first opening; and filling the second opening with a second conductive material to form a second portion of the contact.

Preferably, the exposed surface of the active area is on a source region and/or a drain region of the semiconductor device.

Preferably, the gate structure further comprises a dielectric layer underlying the gate and a spacer for the gate.

Preferably, the gate is a dummy gate, and the gate structure further comprises a dielectric layer underlying the gate and a spacer for the gate, the method further comprises: implanting, after the formation of the gate structure having the dummy gate, so as to form a source region and a drain region in the active area; forming a first interlayer dielectric layer over the substrate, and performing chemical mechanical polishing, so as to expose the top surface of the dummy gate; removing the dummy gate; forming a gate dielectric layer and a metal gate such that an upper surface of the metal gate is substantially flush with an upper surface of the first interlayer dielectric layer.

Preferably, the gate is a metal gate or a poly-silicon gate and the gate structure further comprises a dielectric layer underlying the gate and a space for the gate. The method further comprises: implanting, after the formation of the gate structure, so as to form a source region and a drain region in the active area, forming a first interlayer dielectric layer on the substrate and performing chemical mechanical polishing such that an upper surface of the gate is substantially flush with an upper surface of the first interlayer dielectric layer.

Preferably, the step of filling the first opening with a first conductive material comprises depositing the first conductive material on the substrate such that the first opening is filled with the first conductive material and removing a portion of the first conductive material such that the first conductive material in the first opening remains.

Preferably, a transversal size of the second opening is larger than or equal to a transversal size of the corresponding first opening.

Preferably, at least one second opening is formed so as to substantially expose an upper part of the first portion of the contact and at least a portion of an upper surface of at least one gate.

Preferably, the second conductive material is the same as or different from the first conductive material.

Preferably, the first and second conductive materials are selected from tungsten (W), gold (Au), silver (Ag), rhodium (Rh), iridium (Ir), and copper (Cu).

According to the technical aspects of the present invention, technical effects as below can be at least partly achieved. The contact CD can be easily shrunk to a desired target value. The contact resistance can be well controlled to be well consistent with the designed or calculated result. A desirable process window for interlayer dielectric layer deposition can be obtained. The void issue can be mitigated or addressed. The aspect ratio can be reduced such that the metal deposition process for contact can be simplified. The spacer will substantially not be etched or damaged such that leakage from the top of the gate can be reduced.

The present invention is particularly useful in advanced semiconductor manufacturing technology (such as, logic devices or manufacturing process optimized for logic devices), but the present invention is not intended to be limited thereto. Actually, the present invention can be applicable to extended applications.

Further features, advantages, and features of the present invention will become apparent from the following detailed description of exemplary embodiments according to the present invention with reference to the attached drawings.

BRIEF DESCRIPTION OF THE DRAWINGS

The accompanying drawings, which are incorporated in the specification, serve to explain the principles of the invention together with the description. The present invention will be better understood from the following detailed description of embodiments with reference to the attached drawings. In the drawings:

FIGS. 1-6 are diagrams illustrating a method for manufacturing a semiconductor device according to an embodiment of the present invention, wherein FIG. 1 is a schematic illustration of a substrate with a gate structure over an active area and FIG. 7 is a diagram illustrating a semiconductor device in the prior art.

FIG. 2 shows the substrate of FIG. 1 after formation of an opening.

FIG. 3 shows the substrate of FIG. 2 after forming a first portion contact.

FIG. 4 shows the addition of a second interlayer dielectric layer on the structure of FIG. 3.

FIG. 5 shows the configuration of FIG. 4 after formation of openings.

FIG. 6 shows the configuration of FIG. 5 after filing the openings by a second conductive material.

Figure 1:
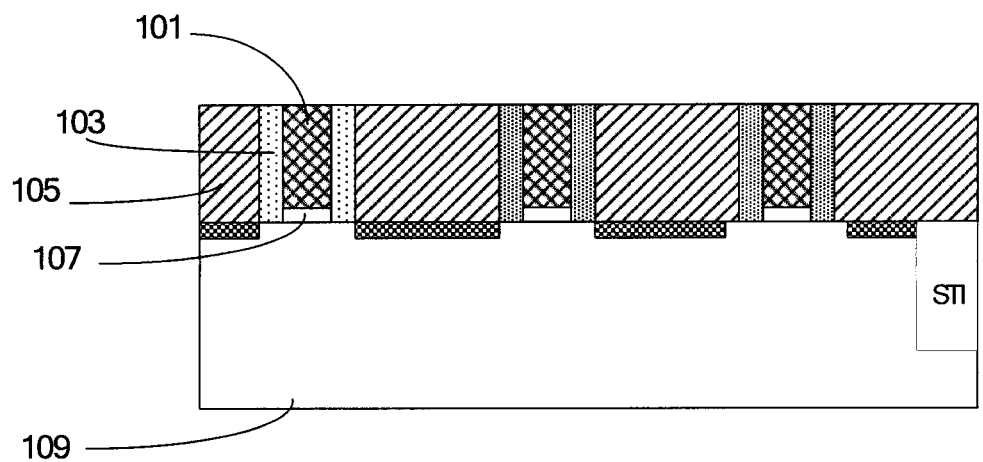

It should be understood that these drawings are merely illustrative and exemplary in nature, and not intended to limit the scope of the present invention. In the drawings, elements are not drawn strictly in scale or according to their actual shapes, in which some of the elements (such as, layers or parts) may be enlarged relative to others so as to more clearly explain the principles of the present invention. Moreover, those details that may obscure the gist of the present invention are not shown in the drawings. In order to not obstruct view of the Figures, similar components are designated by the same crosshatching in all of the Figures, and repetitive reference numerals are not used. Each subsequent Figure references new features.

DESCRIPTION OF THE EMBODIMENTS

The embodiments of the present invention will be described below in conjunction with the drawings.

An embodiment of the present invention will be described in detail with reference to the FIGS. 1-6. Although the technical solution illustrated in the embodiment is preferably used for advanced semiconductor manufacturing technology, one skilled in the art should appreciate that the applications of the embodiment is not limited thereto. Obviously, various concepts or ideas described herein can be adaptively applied to various semiconductor manufacturing processes.

FIG. 1 illustrates a substrate 109 provided according to the embodiment of the present invention. The substrate 109 includes an active area (not shown), for example, being spaced by shallow trench isolation (STI). The substrate 109 further includes a gate structure comprising a gate 101 over the active area. Preferably, the gate structure further comprises a dielectric layer 107 underlying the gate and a spacer 103 for the gate.

In some specific implementations of this embodiment, the gate 101 can be a metal gate or a poly-silicon gate, and the dielectric layer 107 can individually serve as a gate dielectric layer. On the other hand, in other implementations, the gate 101 can be a dummy gate (for example, being formed of, but not limited to, poly-silicon) which will be removed later. In such case, the dielectric layer 107 may be removed, or may serve as a part of the gate dielectric layer in the final device.

A first interlayer dielectric layer 105 is formed over the substrate. In a preferred implementation of this embodiment, the upper surface of the gate 101 is substantially flush with the upper surface of the first interlayer dielectric layer 105, as shown in FIG. 1. The first interlayer dielectric layer 105 can be formed on both sides of the gate structure that are adjacent to the source region and the drain region; however, the present invention is not limited thereto.

In a more specific example, chemical mechanical polishing is performed on the above-described substrate 109 that includes the gate structure and the first interlayer dielectric layer 105, such that the upper surface of the gate 101 is substantially flush with the upper surface of the first interlayer dielectric layer 105.

For example, as for the gate-first (such as a metal gate or a poly-silicon gate) approach, CMP is performed after the formation of the first interlayer dielectric layer 105 such that the upper surface of the gate 101 is exposed. As such, the upper surface of the gate 101 is substantially flush with the upper surface of the first interlayer dielectric layer 105. For example, CMP that exposes the upper surface of the gate 101 can be triggered to stop or can be stopped by timing.

Meanwhile, as for the gate-last approach, the re-coating of an interlayer dielectric layer 105 is not carried out after the metal gate CMP, such that the upper surface of the gate 101 is substantially flush with the upper surface of the first interlayer dielectric layer 105.

In such a manner, it is possible to make the upper surface of the gate 101 substantially flush with the upper surface of the first interlayer dielectric layer 105. As would be appreciated by one skilled in the art it is difficult to avoid process variations or offsets which may be inevitable. Thus, the expression "flush with" used herein covers the expression "substantially flush with", and these two wordings can be used interchangeably throughout the specification and both cover the meaning "flush" under process variations or offsets. In a certain sense, as used herein, the expression "flush with" or "substantially flush with" means that it is not to deliberately be not flush with.

Figure 2:
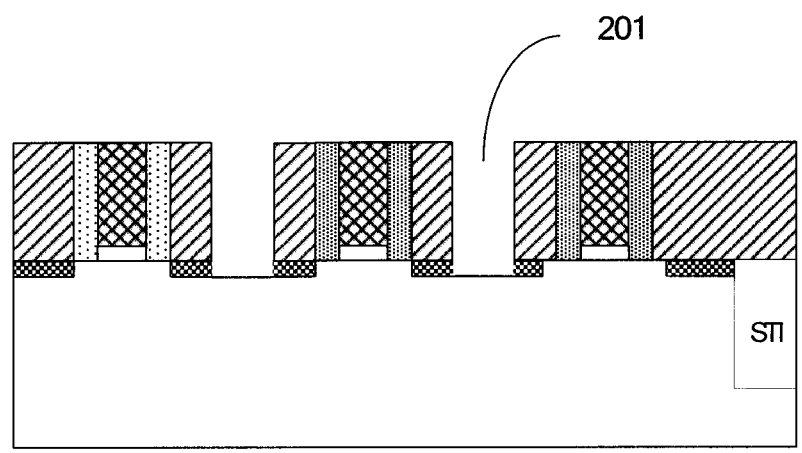

A first opening 201 is formed penetrating through the first interlayer dielectric layer 105 so as to expose a portion of the surface of the active area, as shown in FIG. 2. Preferably, a silicide layer 111 was formed on a surface of the active area on which a contact is to be formed, so as to reduce contact resistance. In some implementations, the step of forming the opening 201 (such as, etching) may lead to some loss of the silicide layer 111, as shown in FIG. 2.

In some implementations, the exposed surface of the active area may be on a source region and/or a drain region (for example, corresponding to the gate structure) in the semiconductor device; however, the present invention is not limited thereto.

As would be appreciated by one skilled in the art, the method of forming a first interlayer dielectric layer 105 having a first opening 201 is not limited to the above. For example, depending on different applications, a patterned first interlayer dielectric layer 105 (for example, having a first opening 201) may be formed on the substrate 109 by means of other methods, such as, droplet discharge method, printing method (such as, screen printing method, etc.), or the like. In such a case, it is possible to make the upper surface of the gate 101 to be substantially flush with the upper surface of the first interlayer dielectric layer 105 by, for example, controlling the thickness of the layer.

Figure 3:
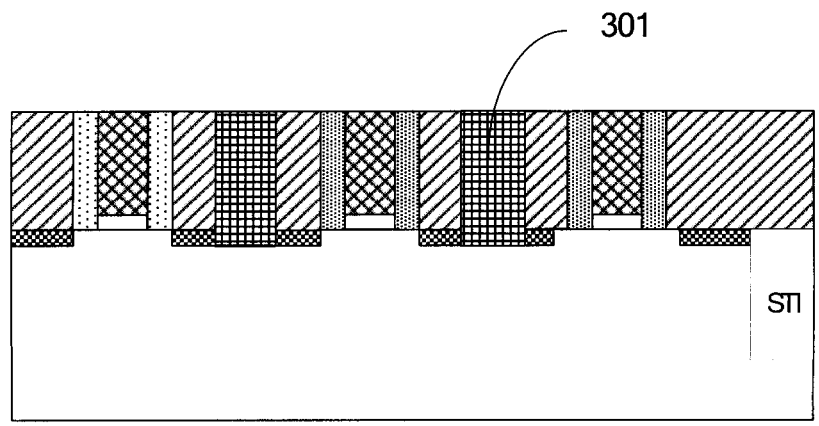

Next, the first opening 201 is filled with a first conductive material so as to form a first portion of a contact 301, as shown in FIG. 3.

In a more particular example, as would be understood by one skilled in the art, filling the first opening 201 with a first conductive material may comprise: depositing the first conductive material on the substrate 109; removing the first conductive material such that the first conductive material in the first opening 201 is remained. For example, chemical mechanical polishing (CMP) can be performed on the first conductive material such that the upper surface of the contact 301 is substantially flush with the upper surface of the first interlayer dielectric layer 105 in the resultant structure.

It is noted that, as would be appreciated by one skilled in the art, although it is preferred that the upper surface of the contact 301 is substantially flush with the upper surface of the first interlayer dielectric layer 105, there is no particular limit regarding the upper surface of the first portion of contact 301. For example, the first portion of contact 301 may partially fill the first opening 201; the upper surface of the first portion of contact 301 may be flush with, or slightly higher or lower than, the upper surface of the first interlayer dielectric layer 105; or, the upper surface of the first portion of contact 301 may protrude from the upper surface of the first interlayer dielectric layer 105. In addition, although it is preferable to perform CMP on the conductive material, the present invention is not limited thereto. For example, unnecessary conductive material may be removed by means of other techniques (such as lithography and etch).

Figure 4:
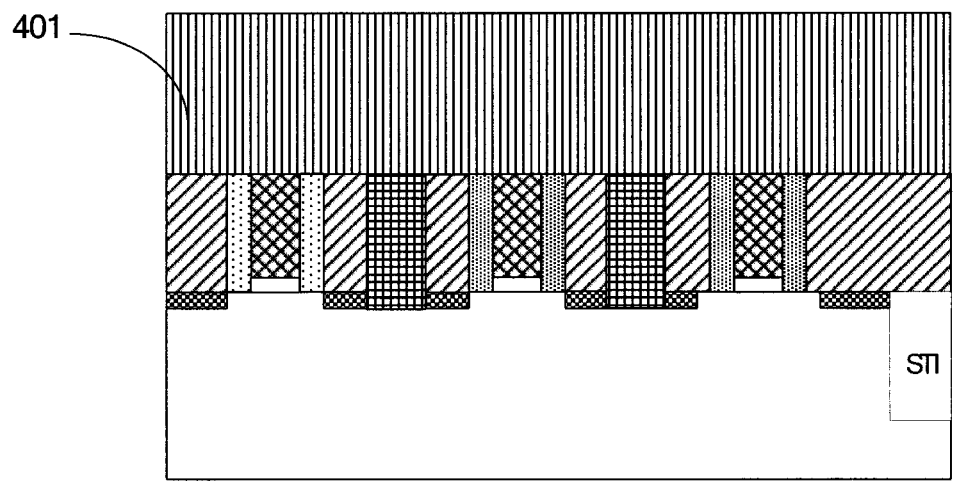
Figure 5:
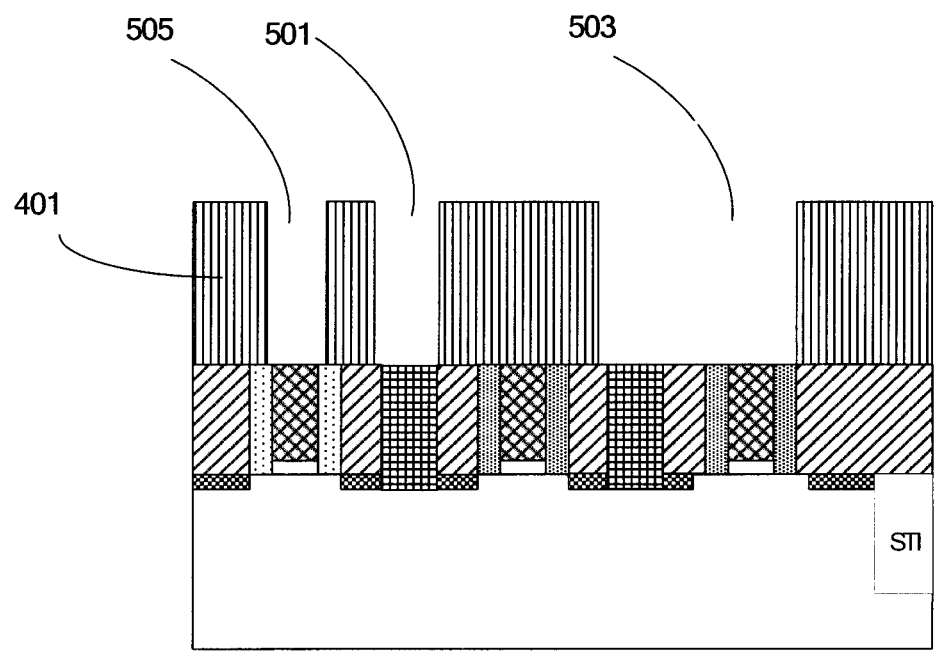

After the formation of the first portion of contact 301, a second interlayer dielectric layer 401 having one or more second openings (501, 503) is formed. In a more particular implementation of the present invention, the step of forming a second interlayer dielectric layer 401 having second openings 501, 503 may comprise: depositing interlayer dielectric material to form a second interlayer dielectric layer 401 that overlays the first interlayer dielectric layer 105 and the conductive material (the first portion of contact 301) in the first opening 201, as shown in FIG. 4; and patterning the second interlayer dielectric layer 401 so as to form a second open penetrating through the second interlayer dielectric layer, the second opening 501, 503 substantially exposing the upper part of the conductive material (the first portion of contact 301) in the first opening 201, as shown in FIG. 5. Preferably, an etch stop layer (not shown) may be formed before the depositing of the second interlayer dielectric layer 401. In an example of this implementation, the patterning can comprise: forming a mask (such as, a hard mask or a resist) on the second interlayer dielectric layer 401, and etching the second interlayer dielectric layer 401 with the mask to form the second opening 501, 503.

Similarly, the method of forming a second interlayer dielectric layer 401 having a second opening 501, 503 is not limited to the above. For example, depending on different applications, a patterned second interlayer dielectric layer 401 (for example, having a second opening) may be formed on the substrate (including the first interlayer dielectric layer 105 and the filler 301) by means of droplet discharge method, printing method (such as, screen printing method, etc.), or the like. Here, the material of the second interlayer dielectric layer 401 can be the same as or different from that of the first interlayer dielectric layer 105.

The second opening 501 can substantially expose the upper part of the conductive material (the first portion of contact 301) in the first open 201. The second opening 503 can substantially expose the upper part of the conductive material (the first portion of contact 301) in the first opening 201 and at least a portion of the upper surface of at least one gate 101. In addition, preferably, the transversal size of the second openings 501, 503 can be larger than or equal to that of the first opening 201.

Figure 6:
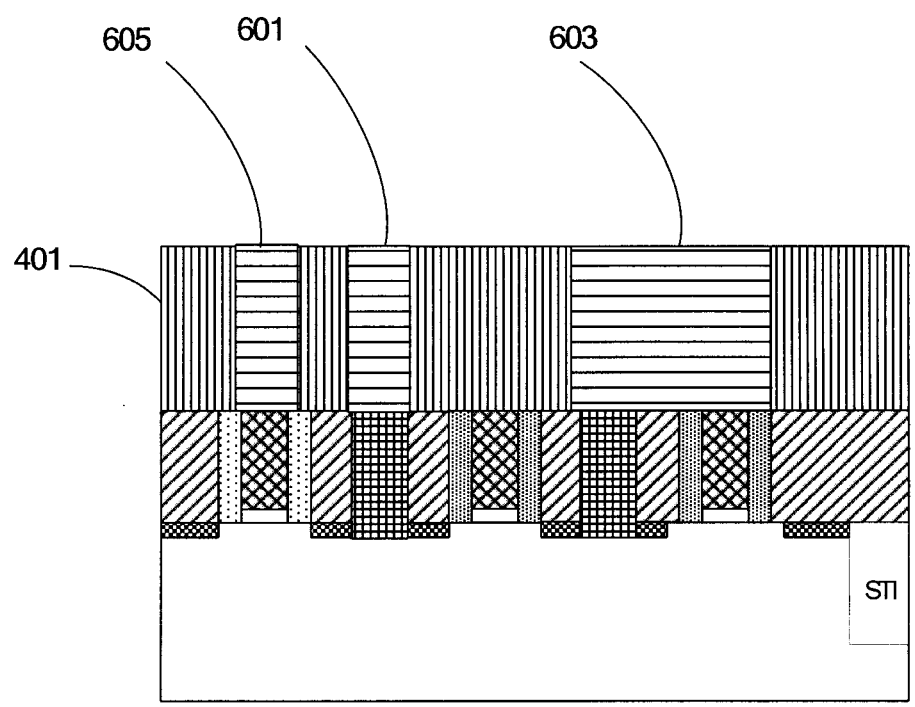
Figure 7:
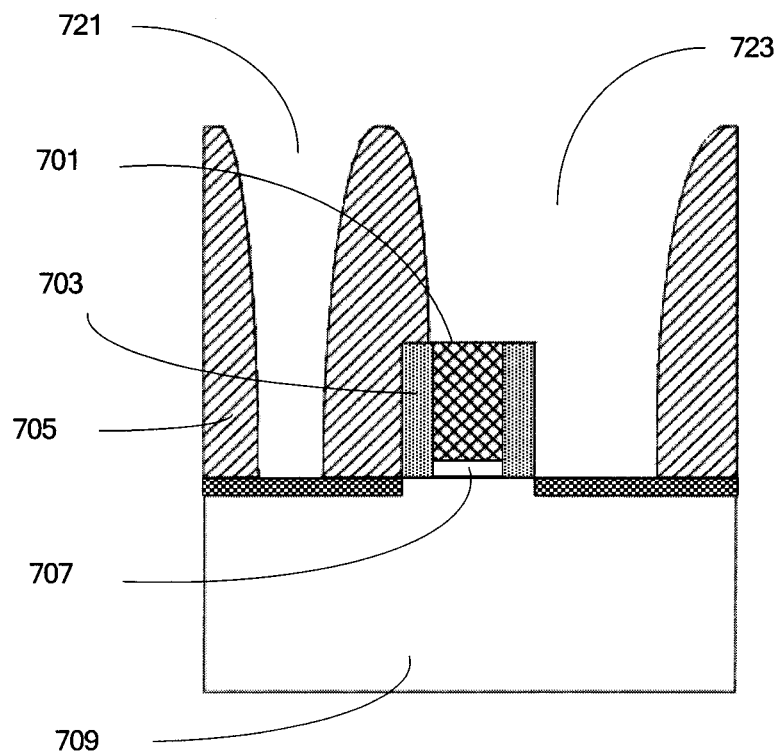

Thereafter, the second opening 501, 503 is filled with the second conductive material so as to form a second portion of contacts 601, 603, as shown in FIG. 6. In a particular example, as would be appreciated by one skilled in the art, the filling the second opening 501, 503 with a second conductive material can comprise: depositing the second conductive material on the substrate such that the second opening 501, 503 is filled with the second conductive material; removing the second conductive material such that the second conductive material in the second opening 501, 503 remains. Typically, chemical mechanical polishing may be performed for the removing, for example, such that, in the resulted structure, the upper surface of the contact is substantially flush with the upper surface of the second interlayer dielectric layer 401.

There are no special limits on the first and second conductive materials, and for example the first and second conductive materials can be selected from tungsten (W), gold (Au), silver (Ag), rhodium (Rh), iridium (Ir), and copper (Cu), or an alloy or stack of any of these elements and/or other elements. According to different implementations of the present invention, the second conductive material may be the same as the first conductive material, such as tungsten (W), gold (Au), silver (Ag), rhodium (Rh), iridium (Ir), and copper (Cu); or the second conductive material may be different from the first conductive material, for example, one of the first and the second conductive materials may be one of the above-described elements (such as, tungsten (W)) while the other may be another one of the above-described elements (such as, copper (Cu), gold (Au), or silver (Ag)).

In a particular example of this embodiment, the second interlayer dielectric layer 401 may have an opening 505 which only extends to the gate 101, such that a contact 605 to the gate is formed through this open 505.

The embodiments of the present invention have been described above with reference to the drawings. It should be appreciated that, however, these embodiments are merely illustrative in nature but not intended to limit the claims of this application. These embodiments can be arbitrarily combined with each other without departing from the scope of the present invention. In addition, the embodiments and details of the present invention can be modified by those skilled in the art in light of the teachings of the invention, without departing from the scope of the present invention. Therefore, all these modifications are embraced within the spirit and scope of the present invention as defined by the attached claims.

What is claimed is:

1. A method for manufacturing a semiconductor device, comprising the steps of:
   providing a substrate for the semiconductor device, the substrate having an active area and a gate structure including a gate on the active area and being formed with a first interlayer dielectric layer over the substrate, wherein the first interlayer dielectric layer has a first opening penetrating through the first interlayer dielectric layer to expose a portion of a surface of the active area, and an upper surface of the first interlayer dielectric layer is substantially flush with an upper surface of the gate;
   filling the first opening with a first conductive material to form a first portion of a contact;
   forming a second interlayer dielectric layer over the first interlayer dielectric layer, the second interlayer dielectric layer having a second opening penetrating through the second interlayer dielectric layer to substantially expose an upper part of the first portion of the contact in the first opening; and
   filling the second opening with a second conductive material to form a second portion of the contact;
   wherein at least one second opening is formed to substantially expose an upper part of the first portion of the contact and at least a portion of an upper surface of at least one gate.

2. The method according to claim 1, wherein the exposed surface of the active area is on one or more of a source region or a drain region in the semiconductor device.

3. The method according to claim 2, wherein the gate structure further comprises a dielectric layer underlying the gate and a spacer for the gate.

4. The method according to claim 1, wherein the gate is a dummy gate, and the gate structure further comprises a dielectric layer underlying the gate and a spacer for the gate, the method further comprising:
   implanting, after the formation of the gate structure having the dummy gate, so as to form a source region and a drain region in the active area;
   forming the first interlayer dielectric layer over the substrate and performing chemical mechanical polishing, so as to expose the top surface of the dummy gate;
   removing the dummy gate; and
   forming a gate dielectric layer and a metal gate such that an upper surface of the metal gate is substantially flush with an upper surface of the first interlayer dielectric layer.

5. The method according to claim 1, wherein the gate is a metal gate or a poly-silicon gate, and the gate structure further comprises a dielectric layer underlying the gate and a spacer for the gate, and
   the method further comprising:
   implanting, after the formation of the gate structure, so as to form a source region and a drain region in the active area;
   forming the first interlayer dielectric layer on the substrate and performing chemical mechanical polishing such that an upper surface of the gate is substantially flush with an upper surface of the first interlayer dielectric layer.

6. The method according to claim 1, wherein the step of filling the first opening with a first conductive material comprises:
   depositing the first conductive material on the substrate such that the first opening is filled with the first conductive material; and
   removing the first conductive material such that at least a portion of the first conductive material in the first opening remains.

7. The method according to claim 1, wherein the transversal size of the second opening is larger than or equal to the transversal size of the corresponding first opening.

8. The method according to claim 1, wherein the second conductive material is the same as or different from the first conductive material.

9. The method according to claim 1, wherein the first and second conductive materials can be selected from: tungsten (W), gold (Au), silver (Ag), rhodium (Rh), iridium (Ir), and copper (Cu).

* * * * *